United States Patent [19]
Casper

[11] Patent Number: 5,644,215
[45] Date of Patent: Jul. 1, 1997

[54] CIRCUIT AND METHOD FOR REGULATING A VOLTAGE

[75] Inventor: Stephen L. Casper, Boise, Id.

[73] Assignee: Micron Technology, Inc., Boise, Id.

[21] Appl. No.: 485,093

[22] Filed: Jun. 7, 1995

[51] Int. Cl.$^6$ .............. G05F 1/40; G05F 1/44; G05F 1/56; G05F 1/618

[52] U.S. Cl. .............. 323/274; 323/279

[58] Field of Search .............. 323/274, 280, 323/281, 297, 353, 354, 279

[56] References Cited

U.S. PATENT DOCUMENTS

| | | | |
|---|---|---|---|
| 4,581,546 | 4/1986 | Allan | 307/297 |
| 4,689,651 | 8/1987 | Hanna et al. | 307/299 |
| 4,904,885 | 2/1990 | Yamada et al. | 307/296.2 |
| 4,947,058 | 8/1990 | Yarbrough et al. | 307/443 |
| 4,972,104 | 11/1990 | Estrada | 307/456 |
| 4,975,798 | 12/1990 | Edwards et al. | 361/56 |

*Primary Examiner*—Edward Tso
*Assistant Examiner*—Bao Q. Vu
*Attorney, Agent, or Firm*—Seed and Berry LLP

[57] ABSTRACT

A circuit regulates a voltage by controlling a voltage generator. A voltage divider is coupled between the regulated voltage and a supply voltage, and generates a sense voltage. A clamp circuit is coupled to the divider, and reduces the sensitivity between the supply voltage and the regulated voltage by substantially prohibiting the voltage across itself from exceeding a predetermined value. A detector circuit is coupled between the divider and the voltage generator, and provides a control signal that deactivates the generator when the sense voltage reaches a first predetermined threshold, and activates the generator when the sense voltage reaches a second predetermined threshold.

34 Claims, 3 Drawing Sheets

CIRCUIT AND METHOD FOR REGULATING A VOLTAGE

TECHNICAL FIELD

The present invention relates generally to electronic devices and more specifically to a circuit for regulating a voltage. In one aspect of the invention, an integrated device such as a memory circuit may incorporate the regulator circuit to regulate a voltage that the device generates internally.

BACKGROUND OF THE INVENTION

Many integrated devices incorporate circuitry to generate a regulated voltage from an external power source for internal use in the device. For example, an electrically erasable and programmable read-only memory (EEPROM) may incorporate such a circuit for internally generating a programming voltage from an external supply voltage. Or, a memory device such as a dynamic random access memory (DRAM) and other types of integrated circuits may include such circuitry for internally generating from an external supply voltage a substrate or back bias voltage to adjust the thresholds of field-effect transistors (FETs) formed in the substrate. Such internal voltage generation often reduces the number of external supply voltages that the integrated device requires for operation.

Typically, such generation and regulation circuitry includes a voltage generator, such as a charge pump, and a voltage regulator that maintains the internally generated voltage at a predetermined voltage level or within a predetermined voltage range. For example, the regulator may activate the generator when the voltage is not at the predetermined level or is outside the predetermined range, and may deactivate the generator once it drives the voltage to the predetermined level or within the predetermined range.

It is often desirable to design an integrated device such that it can operate over a relatively broad range of supply voltages. For example, it may be desirable to design a DRAM that can operate from a supply voltage ranging from approximately 3 to 6 volts.

Some existing voltage regulation circuits can maintain the regulated voltage at a substantially fixed level over the range of external supply voltages within which the integrated device is operational. Such regulation circuits, however, often require a stable reference voltage and associated comparison circuitry. The circuitry that generates the stable reference and the associated comparison circuitry often have a substantial number of components that occupy a relatively large area of the integrated device.

Other existing voltage regulation circuits have a minimum number of components, and thus occupy a minimum area of the integrated device. The level at which the regulator maintains the generated voltage, however, is often sensitive to changes in the supply voltage. That is, the level of the regulated voltage shifts as the supply voltage varies. Such shifts in the regulated voltage are often undesirable.

SUMMARY OF THE INVENTION

According to one aspect of the present invention, a circuit is provided for regulating a voltage by controlling a voltage generator. A voltage divider is coupled between the regulated voltage and a supply voltage, and generates a sense voltage. A clamp circuit is coupled to the divider, and reduces the sensitivity between the supply voltage and the regulated voltage by substantially prohibiting the voltage across itself from exceeding a predetermined value A detector circuit is coupled between the divider and the voltage generator, and provides a control signal that deactivates the generator when the sense voltage reaches a first predetermined threshold, and activates the generator when the sense voltage reaches a second predetermined threshold.

According to another aspect of the invention, the voltage divider includes a plurality of load elements that are serially coupled between the regulated and supply voltages, such that junctions or nodes are formed between consecutive pairs of the elements. The sense voltage is tapped from a selected one of the junctions. The clamp circuit includes a first clamp terminal that is coupled to one of the junctions and a second clamp terminal that is coupled to another of the junctions disposed between the selected junction from which the sense voltage is tapped and the regulated voltage, or that is coupled to the regulated voltage.

According to yet another aspect of the invention, the clamp circuit is coupled between a pair of nodes chosen from the selected junction, the regulated voltage, and those of the junctions that are disposed between the selected junction and the regulated voltage.

According to still another aspect of the invention, the clamp circuit is coupled across the load element that is coupled to the regulated voltage.

DETAILED DESCRIPTION OF THE INVENTION

Figure 1:
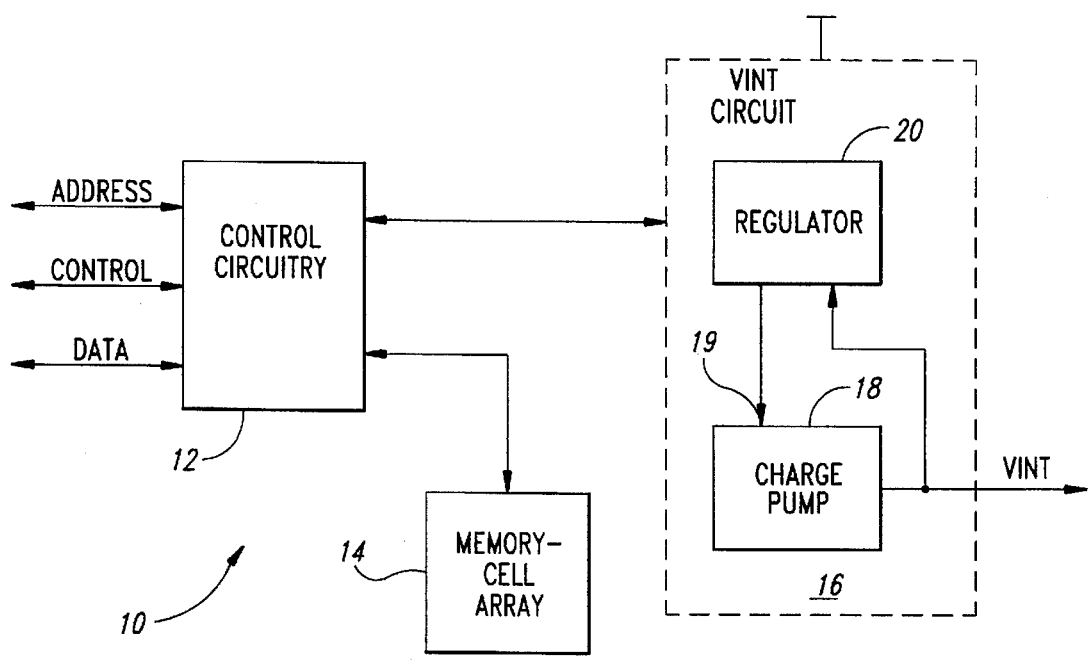
FIG. 1 is a block diagram of a memory device in accordance with the present invention.

FIG. 1 is a block diagram of a memory device 10 that is designed and operates in accordance with the present invention, although the present invention could be used with other types of integrated devices. In one aspect of the invention, memory 10 is a DRAM. Memory 10 includes control circuitry 12 that is coupled to address, control, and data buses to receive address, control, and data signals from external circuitry (not shown), such as may be found in a computer system (not shown). Memory 10 also includes an array 14 of storage or memory cells for storing data, and a voltage generation and regulation circuit 16 that provides an internal voltage $V_{INT}$ from an external power supply voltage $V_{CC}$. $V_{INT}$ may be used for a variety of purposes, including as a programming voltage in a memory 10 that contains electrically programmable memory cells, or as a back bias voltage for biasing a substrate in which field-effect transistors are formed to set or adjust the transistors' threshold values. The internal generation of such a voltage often allows memory 10 to run from a single external supply voltage as opposed to multiple external supply voltages.

The regulation circuit 16 includes a charge pump 18 that generates $V_{INT}$ in response to an activate/deactivate signal that it receives at its control terminal 19. A regulator circuit 20 monitors $V_{INT}$ and generates the activate/deactivate signal in response to the level thereof.

In operation, control circuitry 12 receives the address, control, and data signals on the respective buses, and in accordance with these signals, reads and writes data from and to memory-cell array 14. Additionally, control circuitry 12 provides signals to activate and otherwise control the regulation circuit 16.

When control circuitry 12 activates the regulation circuit 16, the charge pump 18 begins either increasing or decreasing (depending on whether $V_{INT}$ is positive or negative) $V_{INT}$ until it reaches a first predetermined value. When the regulator circuit 20 detects that $V_{INT}$ has reached this first predetermined value, it deactivates the charge pump 18. When $V_{INT}$ becomes unequal to the first predetermined value, or becomes equal to a second predetermined value, which together with the first predetermined value defines a predetermined voltage window that is generated with a hysteresis circuit (described below in conjunction with FIG. 3), then the regulator circuit 20 activates the charge pump 18 to again begin the generation-regulation cycle. Known charge pumps or other types of voltage generating circuits are suitable for use in the regulation circuit 16.

Figure 2:
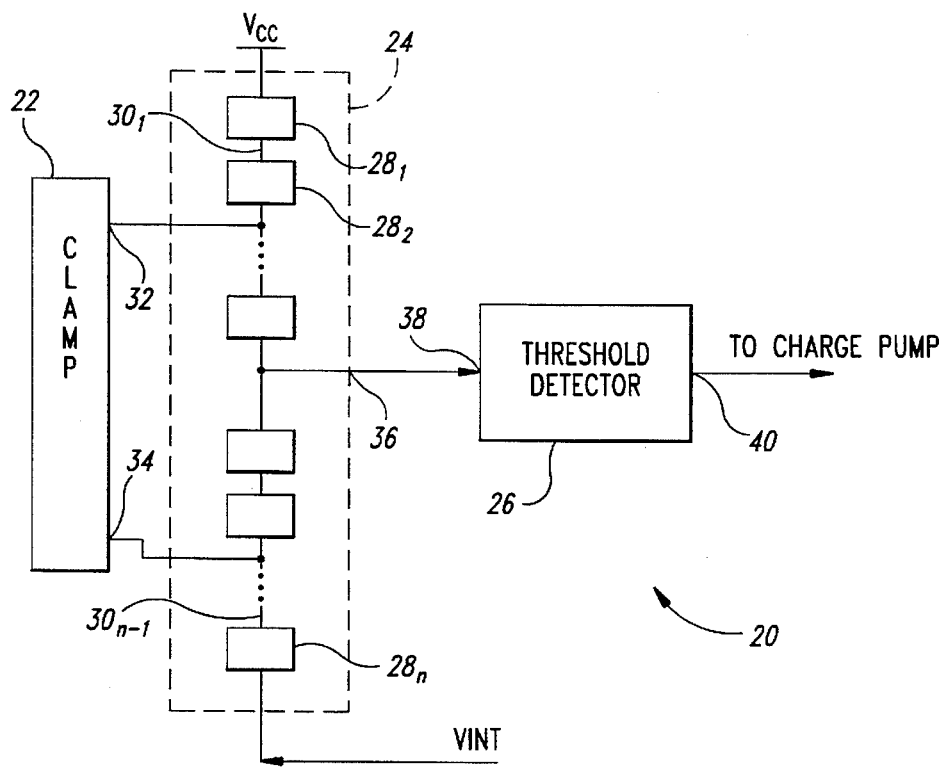
FIG. 2 is a block diagram of a preferred embodiment of the voltage regulator of FIG. 1.

FIG. 2 is a block diagram of a preferred embodiment of the regulator circuit 20 of FIG. 1. The regulator circuit 20 includes a voltage clamping circuit 22 that is coupled to a voltage divider 24. The voltage divider 24 is connected between the supply voltage $V_{CC}$ and the voltage $V_{INT}$ generated by the charge pump 18 (FIG. 1). A threshold detector 26 is coupled between voltage divider 24 and the voltage $V_{INT}$ from the charge pump 18 (FIG. 1). The clamping circuit 22 acts to reduce the amount $V_{INT}$ shifts as $V_{CC}$ varies.

More specifically, the voltage divider 24 includes a plurality of load elements 28 that are serially coupled between the power supply voltage $V_{CC}$ and the internally generated voltage $V_{INT}$. As shown, the exact number of load elements 28 is not critical, as long as there are at least two. The serial coupling of the load elements 28 forms junctions or nodes 30 between consecutive pairs of adjacent load elements 28. As shown, there is one less junction than there are load elements. Terminals 32 and 34 of clamp 22 are coupled to a selected pair of junctions 30. Also, one of the terminals 32 and 34 may be coupled to a junction 30 and the other of terminals 32 and 34 may be coupled to $V_{INT}$. One of junctions 30 is selected as a sense voltage terminal 36, which is coupled to an input terminal 38 of the detector 26. An output terminal 40 of the detector 26 is coupled to the control terminal 19 of the charge pump 18 (FIG. 1). Such a regulator circuit 20 is particularly suited for applications where $V_{INT}$ is maintained at a value lower than that of $V_{CC}$.

In operation, as $V_{INT}$ rises, the sense voltage $V_S$ at terminal 36 also rises in proportion to the ratio of the number and value of the load elements 28 that are located between terminal 36 and $V_{INT}$ to the number and value of the load elements 28 between $V_{CC}$ and $V_{INT}$. As the sense voltage $V_S$ rises above a predetermined value, the detector 26 detects that the sense voltage has surpassed this value, and outputs a signal at the terminal 40 to activate or "turn on" the charge pump 18. The charge pump 18 acts to lower the internal voltage $V_{INT}$. Once voltage $V_{INT}$ falls enough so that the sense voltage $V_S$ falls below the predetermined value, the detector 26 generates a signal at terminal 40 to deactivate, i.e., "turn off", the charge pump 18. In this way, the regulator circuit 20 maintains $V_{INT}$ at a regulated value. As further explained in conjunction with FIG. 3, the detector 26 may have a hysteresis added to it such that it detects the sense voltage $V_S$ passing two predetermined values, one to turn on the charge pump 18 and the second lower predetermined value to turn off the charge pump 18. Such hysteresis may, among other things, prevent oscillation of the detector/charge-pump loop around a single predetermined threshold value.

As can be seen from FIG. 2, and ignoring clamp circuit 22 for the moment, as $V_{CC}$ increases so does sense voltage $V_S$ at terminal 36. Thus, $V_{INT}$ must be driven to a lower voltage in order for the threshold detector 26 to turn off the charge pump 18. As a result, as $V_{CC}$ rises, the regulated value of $V_{INT}$ fails. In order to reduce the interdependence or sensitivity between $V_{CC}$ and $V_{INT}$, the clamp circuit 22 is provided as discussed above. In operation, the clamp circuit prevents the voltage between terminals 32 and 34 from exceeding a predetermined clamp value. That is, the clamp circuit 22 limits the voltage between terminals 32 and 34 to the predetermined clamp value. Once this predetermined clamp voltage has been reached, the clamp circuit 22 in effect removes from divider 24 the load elements 28 that are positioned between terminals 32 and 34. This allows $V_{INT}$ to have a greater proportional effect on the sense voltage $V_S$ at terminal 36. Thus, charge pump 18 need not drive $V_{INT}$ as low to trip the detector 26 than it would need to if the clamp circuit 22 were omitted.

Although, as stated above, the terminals 32 and 34 may be coupled between any pair of junctions 30 or between a junction 30 and voltage $V_{INT}$, a preferred embodiment of the invention is to have terminals 32 and 34 coupled to any pair of junctions 30 that are positioned between terminal 36 and voltage $V_{INT}$ inclusive, i.e., including the junction coupled to terminal 36 and the terminal of the load element $28_n$ that is coupled to $V_{INT}$.

Figure 3:
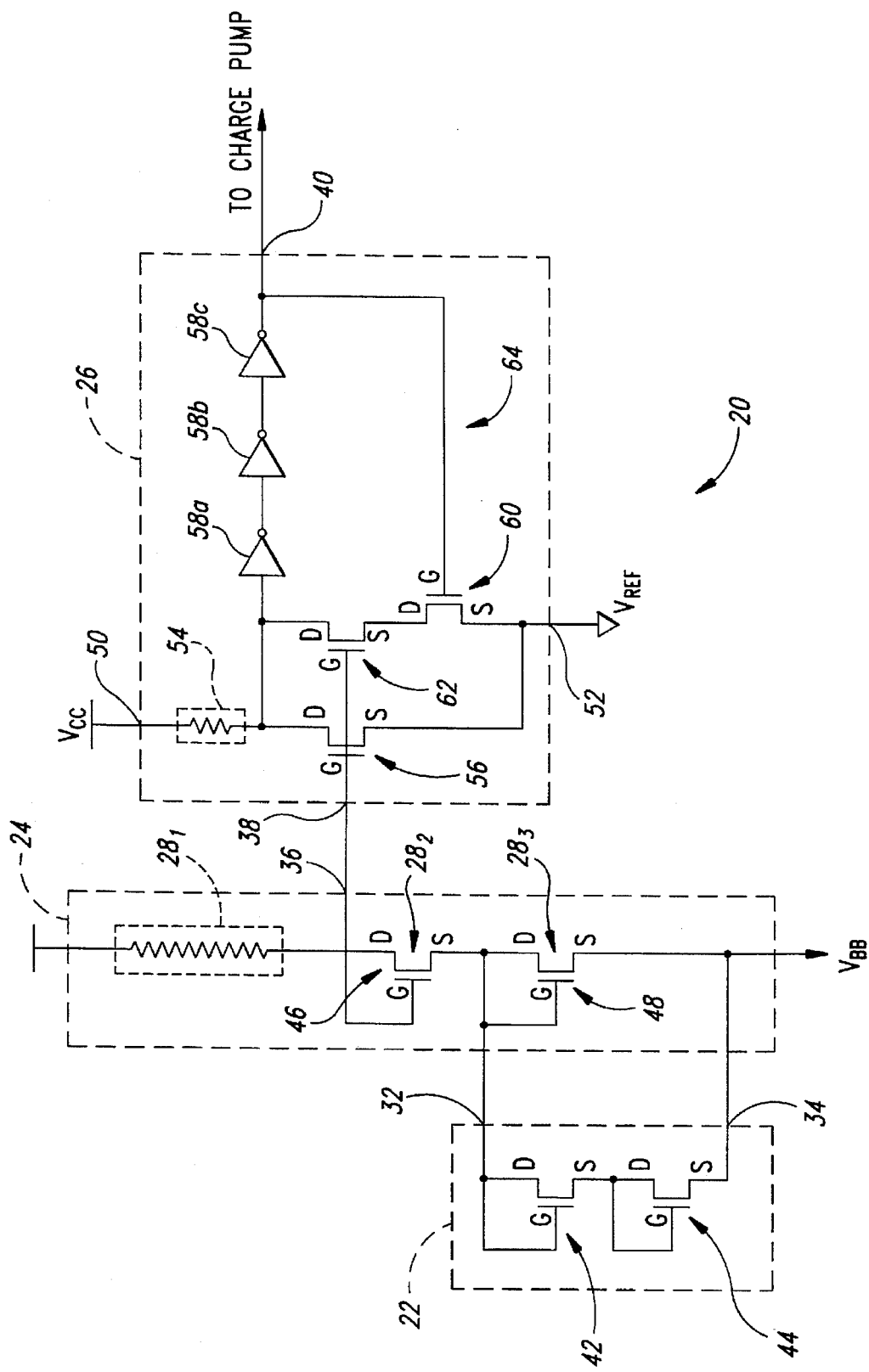
FIG. 3 is a schematic of the preferred embodiment of the regulator of FIG. 2.

FIG. 3 is a circuit diagram of a preferred embodiment of the voltage regulator circuit 20 of FIG. 2. In this embodiment, the regulator circuit 20 is used to regulate a back bias voltage $V_{BB}$ to back bias a substrate (FIG. 4) of the circuit incorporating the regulator circuit 20. As is known in the art, such back biasing provides benefits such as setting the thresholds of the transistors formed in the substrate. As shown, the clamp circuit 22 is formed from a pair of serially coupled diode-connected FET transistors 42 and 44. The voltage divider 24 includes three serially connected load elements $28_1$, $28_2$, and $28_3$. Although it is shown as a single resistor, load element $28_1$ may be formed from multiple load elements of other types such as diode-connected, long-channel FETs. Load element $28_2$ is formed from a diode-connected FET 46, and load element $28_3$ is formed from a long-channel FET 48. As shown, clamp circuit 22 is coupled across, i.e., in parallel with, long-channel transistor 48. The gates, drains, and sources of transistors 42, 44, 46, and 48 are labeled G, D, and S, respectively.

Threshold detector 26 includes a power-supply terminal 50 and a reference terminal 52. A load device 54, which, although shown as a single resistor, may be made up of one or more other types of load elements such as one or more transistors, is coupled between a terminal 50 and the drain terminal of an FET 56. The gate and source of the transistor 56 are respectively coupled to the input terminal 38 and a reference terminal 52. Three inverters 58a–c are serially coupled between the drain of the transistor 56 and the output terminal 40. Although three inverters 58a–c are shown, any odd number of inverters may be used. The gate of an FET 60 is coupled to output terminal 40. The source and drain of the transistor 60 are respectively coupled to a reference terminal 52 and the source of an FET 62. The gate and drain of the FET 62 are respectively coupled to the input terminal 38 and the drain of the transistor 56. The combination of the inverters 58 and the transistors 60 and 62 form a hysteresis circuit 64. In one aspect of the invention, the gate of transistor 60 is the hysteresis-circuit input terminal, the gate of transistor 62 is the hysteresis-circuit control terminal, and the drain of transistor 62 is the hysteresis-circuit drive terminal. As discussed above for circuits 22 and 24, the gates, drains, and sources of the transistors 56, 60, and 62 are respectively labeled G, D, and S. In another aspect of the invention, the hysteresis circuit 64 is omitted, and the drain of transistor 56 may be coupled directly to the output terminal 40.

In a preferred embodiment of the invention, $V_{CC}$ is approximately between 3 and 6 volts, $V_{BB}$ is regulated to approximately between −1 and −2 volts, and $V_{REF}$ is approximately ground or zero volts. However, different voltages may be used as long as $V_{REF}$ is between $V_{CC}$ and $V_{BB}$. Furthermore, load elements $28_1$ and 54 have approximate impedance values of 2 megohm and 200 kilaohms, respectively. The width-to-length ratios of transistors 42, 44, 46, 48, 56, 60, and 62 are approximately 6 microns/1 micron, 6/1, 2/2, 2/6.5, 6/1.5, 6/1, and 6/1, respectively.

In operation, as voltage $V_{BB}$ rises, the sense voltage $V_S$ at the terminal 36 of the voltage divider 24 also rises. When the sense voltage $V_S$ is approximately the threshold voltage of the transistor 56 above $V_{REF}$, the transistor 56 turns on, i.e., conducts. As the sense voltage $V_S$ increases further, the transistor 56 becomes saturated and thus drives the voltage at its drain to approximately $V_{REF}$. The voltage at the drain of the transistor 56 is considered a logic low, which propagates through inverters 58 such that inverter 58c generates a logic high at terminal 40. This logic high voltage activates the charge pump 18, which begins to drive voltage $V_{BB}$ to a lower level. The logic high at terminal 40 also turns on the transistor 60, and the sense voltage $V_S$ turns on the transistor 62. Thus, the transistors 60 and 62, which are driven at or near saturation, reinforce the voltage $V_{REF}$ that appears at the drain of the transistor 56. That is, the transistors 60 and 62 provide hysteresis to the detector 26, such that sense voltage $V_S$ must fall to a value lower than that at which it turned on transistor 56 in order for detector 26 to output a logic low to shut off the charge pump 18. Thus, the hysteresis loop in effect forms a threshold window with upper and lower predetermined values. When the sense voltage $V_S$ increases above the upper, i.e., first predetermined value, the detector 26 turn on the charge pump 18, and when the sense voltage $V_S$ falls below the lower, i.e., second predetermined value, the detector 26 turns off the charge pump 18. In this way, the regulator circuit 20 maintains voltage $V_{BB}$ within a predetermined range that can be adjusted by varying the threshold window of the detector 26.

In order to reduce the sensitivity between $V_{CC}$ and both the sense voltage $V_S$ and $V_{BB}$, the clamp circuit 22 is coupled across the long channel transistor 48. Because the clamp circuit 22 includes two serially coupled diode-connected transistors 42, 44, the clamping voltage will be approximately the sum of the thresholds of the transistors 42 and 44. In one aspect of the invention, the clamping voltage provided by the clamp circuit 22 is approximately between 1 and 2 volts. As the voltage across the transistor 48 increases above the clamping voltage, the clamp circuit 22 maintains the voltage across transistor 48 at a substantially constant value, and reduces or eliminates the affect of the resistance formed by the transistor 48. Thus, with only the resistance of the transistor 46 effectively between $V_{BB}$ and the sense voltage, a change in $V_{BB}$ will result in a larger proportionate change in the sense voltage $V_S$. Therefore, as $V_{CC}$ increases beyond a certain level, the clamp circuit 22 clamps the voltage across the transistor 48, and allows the regulator circuit 20 to maintain $V_{BB}$ at a higher value than it could without the clamp circuit 22. That is, for changes in $V_{CC}$, the clamp circuit 22 reduces or eliminates the corresponding variations in $V_{BB}$. Therefore, the regulator circuit 20 can maintain $V_{BB}$ at a more constant level.

Figure 4:
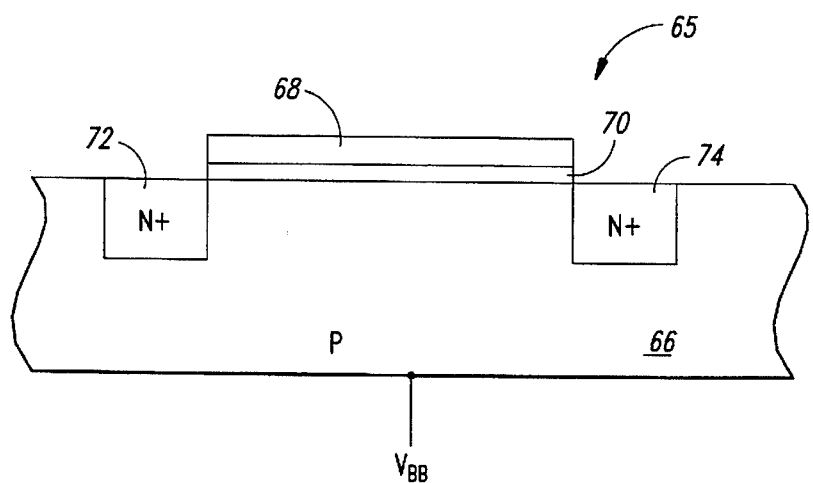
FIG. 4 is a cross section of a portion of a substrate of the memory device of FIG. 1.

FIG. 4 is a cross-sectional view of an n-channel FET transistor 65 formed in a p substrate 66. The transistor 65 includes a conductive gate 68, a gate insulator or dielectric 70, a drain 72, and a source 74. By biasing the substrate 66 to a negative voltage with respect to the source 74, the threshold of the transistor 65 can be adjusted. Additionally, other known benefits can also be obtained. For an n substrate containing a p-channel transistor (both not shown), the back bias voltage would be positive.

Figure 5:
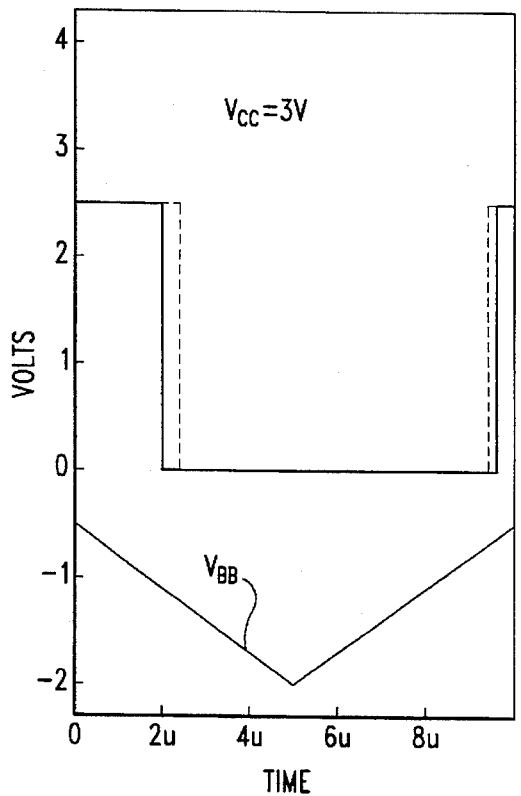
FIG. 5 is a graph showing the improved voltage regulation provided by the regulator of FIG. 3.

FIG. 5 is a graph of a computer simulation that plots the output of the detector 26 (shown in solid line) with the clamp circuit 22 present and the output of the detector 26 (shown in broken line) with the clamp circuit 22 omitted versus $V_{BB}$ for $V_{CC}$=2.5 volts. As shown, with the clamp circuit 22 present, the regulator circuit 20 turns off the charge pump 18 when $V_{BB}$ falls to approximately −1.1 volts, and turns on the charge pump when $V_{BB}$ rises to approximately −0.7 volts. With the clamp circuit 22 not present, the regulator circuit 20 turns off the charge pump 18 when $V_{BB}$ is approximately −1.2 volts and turns on the charge pump 18 when $V_{BB}$ is approximately −0.8 volts.

Figure 6:
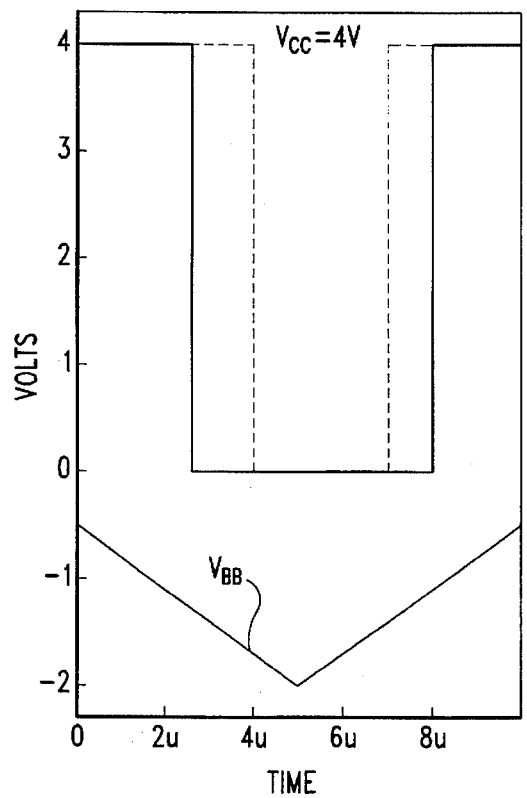
FIG. 6 is another graph showing the improved regulation provided by the circuit of FIG. 3.

Referring to FIG. 6, a similar graph to that shown in FIG. 5 is shown for $V_{CC}$=4 volts. As shown, with the clamp circuit 22 installed, the regulator circuit 20 turns off the charge pump 18 when $V_{BB}$ is approximately −1.3 volts, and turns on the charge pump 18 when $V_{BB}$ is approximately −1.1 volts. With the clamp circuit 22 removed, the regulator circuit 20 turns off the charge pump 18 when $V_{BB}$ is approximately −1.7 volts and turns on the charge pump when $V_{BB}$ is approximately −1.4 volts.

Referring to FIGS. 5 and 6, it is evident that the two trip points, i.e., charge pump off, charge pump on, for the regulator circuit 20 incorporating the clamp circuit 22 have changed −0.2 and −0.4 volts, respectively, from $V_{CC}$=2.5 volts to $V_{CC}$=4 volts. For the regulator circuit 20 omitting the clamp circuit 22, the differences in the off and on trip points are −0.5 and −0.6 volts. Thus, the clamp circuit 22 significantly reduces the shifting of $V_{BB}$ with changes in $V_{CC}$.

It will also be evident that, although specific embodiments of the invention have been described herein for purposes of illustration, various modifications may be made without deviating from the spirit and scope of the invention. For example, the n-channel transistors may be substituted with p-channel transistors or bipolar transistors.

We claim:

1. A circuit for regulating a voltage by controlling a voltage generator, comprising:

a voltage divider coupled between said regulated voltage and a supply voltage and operable to generate a sense voltage;

a clamp circuit coupled across a portion of said divider and operable to reduce the sensitivity between said supply voltage and said regulated voltage by substantially prohibiting the voltage across said portion from exceeding a predetermined value; and a detector circuit coupled to said divider and to said voltage generator and operable to generate a control signal that deactivates said generator when said sense voltage equals a first threshold voltage and that activates said generator when said sense voltage equals a second threshold voltage.

2. The circuit of claim 1 wherein:

said voltage divider comprises a plurality of load elements serially coupled between said regulated and supply voltages and a plurality of junctions disposed between consecutive pairs of said elements, said voltage divider operable to generate said sense voltage at one of said junctions; and said clamp circuit comprises a first clamp terminal that is coupled to one of said junctions and a second clamp terminal that is coupled to said regulated voltage or to another of said junctions that is disposed between said junction at which said sense voltage is generated and said regulated voltage.

3. The circuit of claim 1 wherein:

said voltage divider comprises load elements serially coupled between said supply and regulated voltages and junctions disposed between consecutive ones of said elements, said divider operable to generate said sense voltage at a first one of said junctions; and said clamp circuit is coupled to a pair of nodes selected from said first junction, said regulated voltage, and those of said junctions that are disposed between said first junction and said regulated voltage.

4. The circuit of claim 3 wherein one or more of said load elements each comprise a diode-coupled transistor.

5. The circuit of claim 3 wherein said clamp circuit comprises one or more diode-coupled transistors connected in series.

6. The circuit of claim 1 wherein:

said voltage divider comprises multiple load elements serially coupled between said supply and regulated voltages and junctions disposed between consecutive ones of said elements, said divider operable to generate said sense voltage at a selected one of said junctions; and said clamp circuit is coupled across the load element that is directly coupled to said regulated voltage.

7. The circuit of claim 1 wherein said detector circuit comprises:

a load element coupled to said supply voltage; and a switch serially coupled between said load element and a reference voltage and having a control terminal coupled to receive said sense voltage, said switch operable to generate said control signal at the junction of said switch and said load element by closing when said sense voltage equals or exceeds said second threshold voltage and opening when said sense voltage is equal to or is less than said first voltage.

8. The circuit of claim 7 wherein said detector circuit further comprises an inverter having an input coupled to said junction and operable to generate said control signal at an output.

9. The circuit of claim 1 wherein said detector circuit comprises an input terminal, an output terminal, and a hysteresis circuit coupled between said input and output terminals.

10. The circuit of claim 1 wherein said first threshold voltage is less than said second threshold voltage.

11. A circuit for regulating a voltage by controlling a charge pump that generates said regulated voltage and has a charge-pump control terminal, said circuit comprising:

a voltage divider having a first supply terminal coupled to said regulated voltage, a second supply terminal coupled to a supply voltage, and a sense terminal that carries a sense voltage;

a clamp circuit coupled across a section of said divider to reduce the amount the sense voltage changes when the supply voltage changes by substantially prohibiting the voltage across said section from exceeding a predetermined value; and a detector circuit having a detector input terminal coupled to said sense terminal and a detector output terminal coupled to said charge-pump control terminal, wherein said detector output terminal carries a control signal that deactivates said charge pump when said sense voltage is equal to a first predetermined threshold voltage and activates said charge pump when said sense voltage is unequal to said first predetermined threshold voltage.

12. The circuit of claim 11 wherein:

said voltage divider comprises multiple load elements that are serially coupled between said first and second and supply terminals and that define junctions between consecutive ones of said elements;

said sense terminal is coupled to one of said junctions; and said clamp circuit comprises a first clamp terminal that is coupled to one of said junctions and a second clamp terminal that is either coupled to said first supply terminal or to another of said junctions that is located between said sense terminal and said first supply terminal.

13. The circuit of claim 12 wherein one or more of said load elements each comprise a transistor coupled in a diode configuration.

14. The circuit of claim 12 wherein said clamp circuit comprises one or more serially coupled transistors each connected in a diode configuration.

15. The circuit of claim 11 wherein:

said voltage divider comprises multiple load elements serially coupled between said first and second supply terminals and junctions located between adjacent ones of said elements;

said sense terminal is coupled to one of said junctions; and said clamp circuit has first and second clamp terminals respectively coupled to first and second ones of said junctions that are disposed between said sense terminal and said first supply terminal.

16. The circuit of claim 11 wherein:

said voltage divider comprises multiple load elements that are serially coupled between said first and second supply terminals and that define junctions between consecutive ones of said elements;

said sense terminal is coupled to one of said junctions; and said clamp circuit is coupled in parallel with the load element that is directly coupled to said first supply terminal.

17. The circuit of claim 11 wherein said detector circuit further comprises:

a detector reference terminal and a detector supply terminal;

at least one load element having a first load terminal coupled to said detector supply terminal and second load terminal coupled to said detector output terminal; and a first switch having a first terminal coupled to said detector output terminal, a second terminal coupled to said detector reference terminal, and a control terminal coupled to said detector input terminal, said switch closing when said sense voltage exceeds said first predetermined threshold voltage and opening when said sense voltage is less than said first predetermined threshold voltage.

18. The circuit of claim 17 wherein said detector circuit further comprises an odd number of serially coupled inverters interposed between said first terminal of said first switch and said detector output terminal, a first of said inverters having an inverter input terminal coupled to said first terminal and a last of said inverters having an inverter output terminal coupled to said detector output terminal.

19. The circuit of claim 18 wherein said detector circuit further comprises a hysteresis circuit having a hysteresis input terminal coupled to said detector output terminal and a hysteresis drive terminal coupled to said first terminal of said first switch.

20. The circuit of claim 19 wherein said hysteresis circuit further comprises:

a hysteresis control terminal coupled to said detector input terminal;

a hysteresis output terminal coupled to said detector reference terminal;

a second switch having a first terminal, a second terminal coupled to said hysteresis output terminal, and a control terminal coupled to said hysteresis input terminal; and a third switch having a first terminal coupled to said hysteresis drive terminal, a control terminal coupled to said hysteresis control terminal, and a second terminal coupled to said first terminal of said second switch.

21. The circuit of claim 11 wherein said detector circuit further comprises a hysteresis circuit having a hysteresis input terminal coupled to said detector output terminal and a hysteresis control terminal coupled to said detector input terminal.

22. The circuit of claim 11 wherein said detector circuit activates said charge pump when said sense voltage becomes equal to a second predetermined threshold voltage.

23. A memory circuit, comprising:

a supply terminal operable to receive a power-supply voltage;

a control circuit operable to receive address, data, and control signals;

an array of memory cells in communication with said control circuit; and a voltage circuit operable to provide a regulated voltage, comprising a charge pump operable to generate said regulated voltage;

a voltage divider coupled between said regulated voltage and said supply terminal and operable to generate a sense voltage;

a clamp circuit coupled across a portion of said divider and operable to increase the sensitivity between said regulated voltage and said sense voltage by substantially prohibiting the voltage across said portion from exceeding a clamp value; and a detector circuit coupled to said divider and to said charge pump and operable to generate a control signal that deactivates said charge pump when said sense voltage equals a first threshold voltage and activates said charge pump when said sense voltage equals a second threshold voltage.

24. The circuit of claim 23 wherein:

said voltage divider comprises a plurality of load elements serially coupled between said regulated voltage and said supply terminal and a plurality of junctions defined between adjacent pairs of said elements, said voltage divider operable to generate said sense voltage at a selected one of said junctions; and said clamp circuit comprises a first clamp terminal that is coupled to one of said junctions and a second clamp terminal that is coupled either to said regulated voltage or to another of said junctions that is disposed between said selected junction and said regulated voltage.

25. The circuit of claim 23 wherein:

said voltage divider comprises load elements serially coupled between said supply terminal and said regulated voltage and junctions disposed between consecutive ones of said elements, said divider operable to generate said sense voltage at a selected one of said junctions; and said clamp circuit is coupled between a pair of nodes chosen from a group of nodes that include said selected junction, said regulated voltage, and those of said junctions that are positioned between said selected junction and said regulated voltage.

26. The circuit of claim 23 wherein:

said voltage divider comprises multiple load elements serially coupled between said supply terminal and said regulated voltage and junctions disposed between consecutive ones of said elements, said divider operable to generate said sense voltage at a selected one of said junctions; and said clamp circuit is coupled across the load element that is directly coupled to said regulated voltage.

27. The circuit of claim 26 wherein one or more of said load elements each comprise a diode-coupled transistor.

28. The circuit of claim 26 wherein said clamp circuit comprises one or more diode-coupled transistors connected in series.

29. The circuit of claim 23 wherein said detector circuit comprises:

a load element having a first terminal coupled to said supply terminal, and having a second terminal; and a switch serially coupled between said second terminal and a reference voltage and having a control terminal that receives said sense voltage, said switch operable to generate said control signal at said second terminal by closing when said sense voltage equals or exceeds said second threshold voltage and opening when said sense voltage equals or is less than said first threshold voltage.

30. The circuit of claim 23 wherein:

said memory circuit further comprises a substrate in which a plurality of transistors are formed; and said regulated voltage is coupled to said substrate as a back-bias voltage.

31. A method for regulating a voltage, comprising:

generating a plurality of intermediate voltages between said regulated voltage and a supply voltage;

deactivating a circuit that generates said regulated voltage when a selected one of said intermediate voltages equals a first value;

activating said circuit when said selected voltage equals a second value; and clamping the difference between a pair of said intermediate voltages or one of said intermediate voltages and said regulated voltage to reduce the sensitivity between said supply voltage and said selected intermediate voltage.

32. The method of claim 31 wherein said clamping further comprises clamping the difference between a first of said intermediate voltages and either said regulated voltage or a second of said intermediate voltages that is between said selected intermediate voltage and said regulated voltage.

33. The method of claim 31 wherein said clamping further comprises clamping the difference between a first of said intermediate voltages and a second of said intermediate voltages or said regulated voltage.

34. The method of claim 31 wherein said second value is greater than said first value.

* * * * *